(12) United States Patent
Matsushima (10) Patent No.: US 6,984,882 B2
(45) Date of Patent: Jan. 10, 2006

(54) SEMICONDUCTOR DEVICE WITH REDUCED WIRING PATHS BETWEEN AN ARRAY OF SEMICONDUCTOR CHIP PARTS

(75) Inventor: Hironori Matsushima, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/348,013

(22) Filed: Jan. 22, 2003

(65) Prior Publication Data
US 2003/0234434 A1    Dec. 25, 2003

(30) Foreign Application Priority Data
Jun. 21, 2002   (JP) .............................. 2002-181809

(51) Int. Cl.
*H01L 23/02*   (2006.01)
(52) U.S. Cl. ...................... 257/686; 257/723; 257/685; 257/777
(58) Field of Classification Search ................ 257/686, 257/779, 777, 723, 784, 786, 778, 690, 707, 257/685, 776
See application file for complete search history.

(56) References Cited

U.S. PATENT DOCUMENTS 5,060,052 A * 10/1991 Casto et al. ................ 257/723
5,225,633 A * 7/1993 Wigginton ................ 174/84 R
6,504,244 B2 * 1/2003 Ichinose et al. ............ 257/723
6,627,480 B2 * 9/2003 Kim ........................... 438/109
6,841,881 B2 * 1/2005 Katagiri et al. ............. 257/777
2002/0014689 A1 * 2/2002 Lo et al. ..................... 257/686
2002/0070446 A1 * 6/2002 Horiuchi et al. ............ 257/723
2002/0109236 A1 * 8/2002 Kim et al. .................. 257/777

FOREIGN PATENT DOCUMENTS

| JP | 06-204393 |   | 7/1994 |
| JP | 09-74167 | * | 3/1997 |
| JP | 11-145374 |   | 5/1999 |
| JP | P2001-111192 A |   | 4/2001 |

* cited by examiner

Primary Examiner—Nathan J. Flynn
Assistant Examiner—Tan Tran
(74) Attorney, Agent, or Firm—McDermott Will & Emery LLP

(57) ABSTRACT

There is provided a semiconductor device comprising a semiconductor chip and an electronic part disposed adjacent to each other, wherein a terminal is provided on the side of each of the semiconductor chip and the electronic part, and the terminal is electrically connected to the other terminal in the state where the sides of the semiconductor chip and the electronic part approach to each other. Thereby, the size of the entire semiconductor device can be reduced, and the wiring path can be shortened significantly to improve electrical properties.

1 Claim, 7 Drawing Sheets

SEMICONDUCTOR DEVICE WITH REDUCED WIRING PATHS BETWEEN AN ARRAY OF SEMICONDUCTOR CHIP PARTS

BACKGROUND OF THE INVENTION

1. Field of the Invention

The present invention relates to a semiconductor device, and more specifically to a semiconductor device comprising a plurality of arrayed chip parts.

2. Background Art

Recently, in order to packaging semiconductor chips in high density, a semiconductor device having a plurality of chips mounted on a packaging substrate (multi-chip package) has widely been used.

Figure 11:
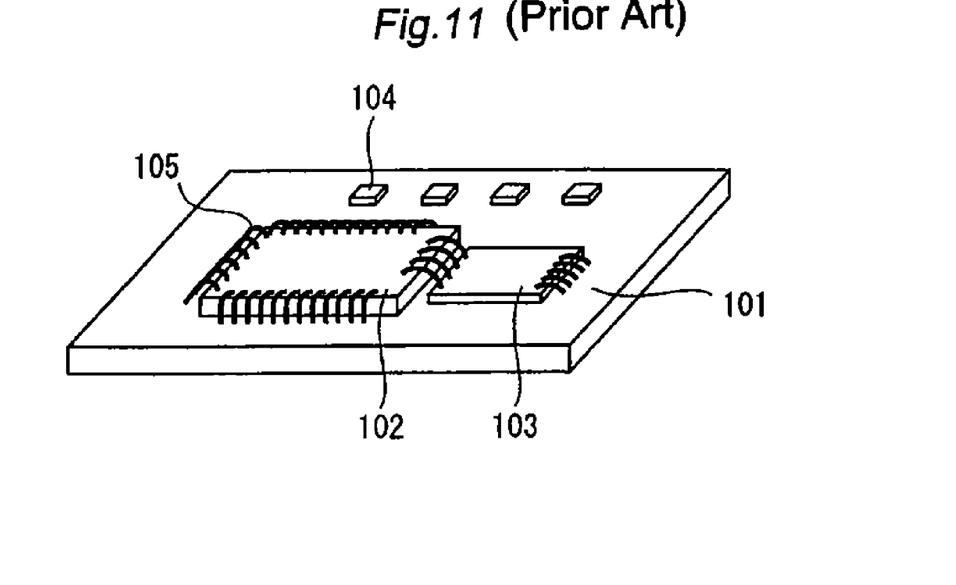
FIG. 11 is a perspective view showing a semiconductor device wherein semiconductor chips, and chip parts such as a capacitor are two-dimensionally mounted on a packaging substrate.
Figure 12:
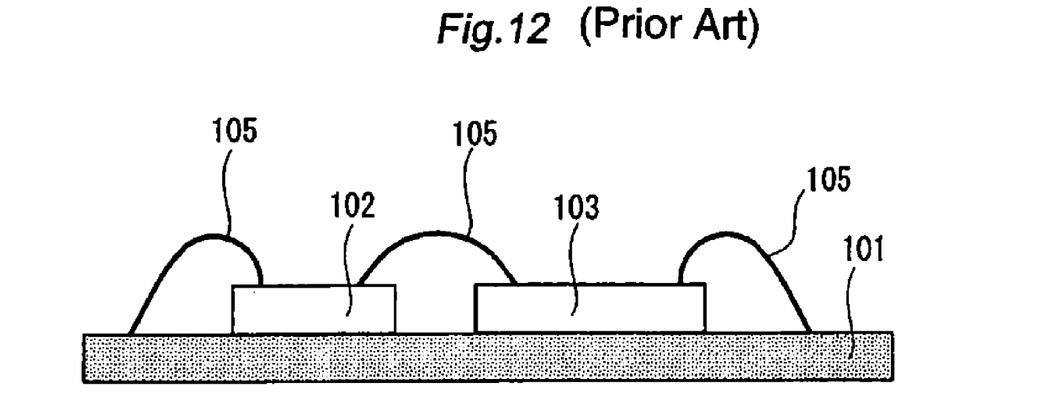
FIG. 12 is a side view showing the semiconductor device shown in FIG. 11.

FIG. 11 is a perspective view showing a semiconductor device wherein semiconductor chips 102 and 103, and chip parts 104 such as a capacitor are two-dimensionally mounted on a packaging substrate 101. FIG. 12 is a side view showing the semiconductor device shown in FIG. 11. As FIGS. 11 and 12 show, each of the semiconductor chips 102 and 103 is electrically connected to the packaging substrate 101 with a gold wire 105. The semiconductor chips 102 and 103 are also electrically connected to each other by connecting the electrode pads on both chips with a gold wire 105.

However, in the semiconductor device shown in FIGS. 11 and 12, since the semiconductor chips 102 and 103 are electrically connected to each other with a gold wire 105, the length of the path of the wiring for connecting both chips is inevitably long.

To connect the semiconductor chips 102 and 103 with a gold wire 105, both chips must be disposed apart from each other by a predetermined distance or more, resulting in a long wiring path.

The chip parts 104 must also be disposed apart from the semiconductor chips 102 and 103 from the limitation on assembling, causing the path of the wiring pattern between the chip parts 104 and the semiconductor chips 102 and 103 to become long. Since the semiconductor chips 102 and 103 and the chip parts 104 must be apart from each other, the length of the path of the wiring pattern disposed on the packaging substrate 101 around these parts also becomes long.

Increase in the length of the wiring path leads to the degradation of electrical properties of semiconductor devices, and the increase of the package size of the semiconductor device.

SUMMARY OF THE INVENTION

The object of the present invention is to solve the above-described problems, to improve the electrical properties of semiconductor devices produced by mounting a plurality of parts on a substrate, and to realize the reduction of the package size.

According to one aspect of the present invention, a semiconductor device comprises a plurality of arrayed chip parts. A terminal is provided on each side of at least two of the chip parts. The terminal is electrically connected each other in the state where the sides of the chip parts approach to each other.

According to another aspect of the present invention, a semiconductor device comprises a plurality of arrayed chip parts. A electrode pad is formed on each upper surface of at least two of the chip parts. A tape whereon a predetermined conductive pattern is formed is bonded on the electrode pad of the chip parts. The chip parts are electrically connected to each other with the conductive pattern.

Since terminals on the sides of chip parts are electrically connected each other, the total size of a semiconductor device containing chip parts can be reduced. Since no wiring such as gold wires is required for the electrical connection of chip parts to each other, the wiring path can be shortened significantly, and the electrical properties of semiconductor devices can be improved.

By bonding a tape, whereon a predetermined conductive pattern is formed, on the electrode pad of chip parts, the chip parts can be electrically connected to each other.

Other and further objects, features and advantages of the invention will appear more fully from the following description.

DETAILED DESCRIPTION OF THE PREFERRED EMBODIMENTS

First Embodiment

Figure 1:
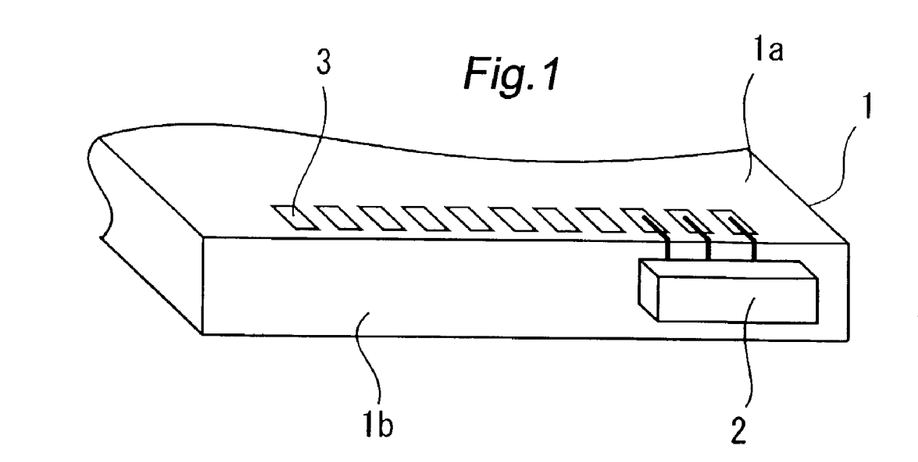
FIG. 1 is a schematic diagram showing a semiconductor device according to First Embodiment of the present invention.
Figure 1A:
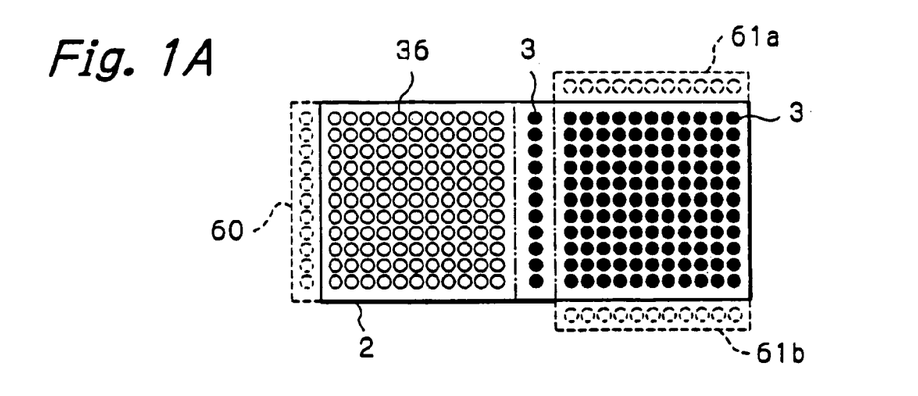
Figure 1B:
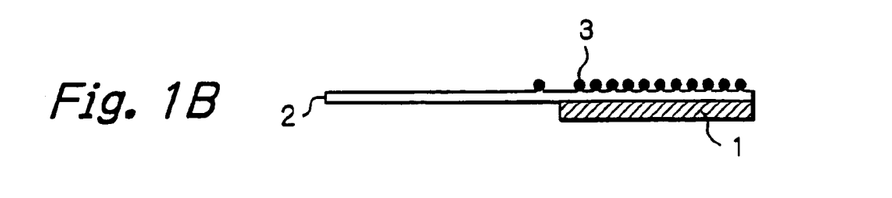
Figure 1C:
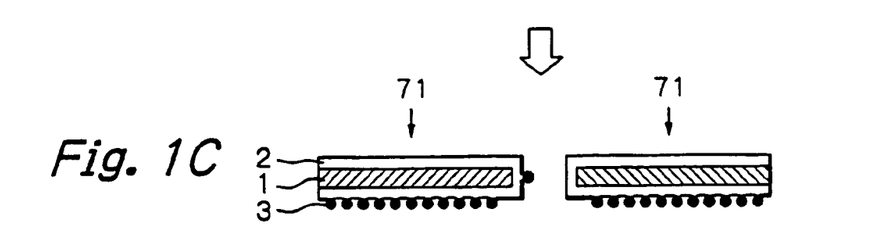
Figure 1D:
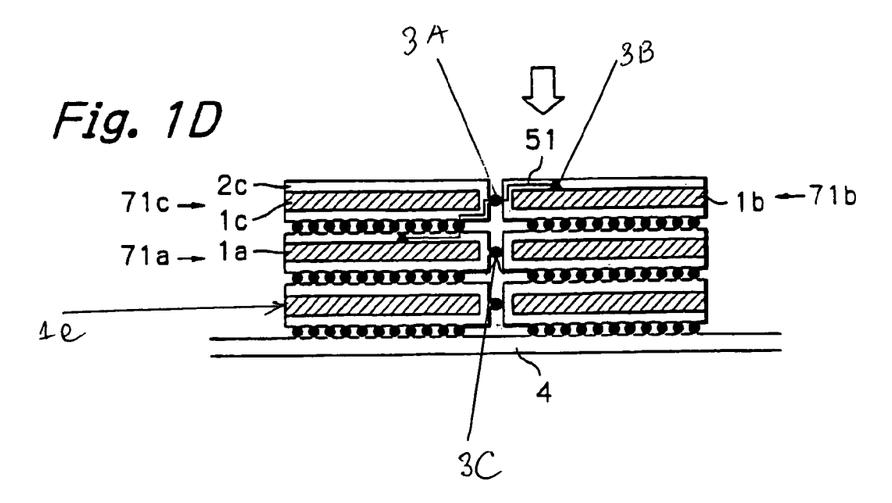

FIG. 1 is a schematic diagram showing a semiconductor device according to First Embodiment of the present invention. This semiconductor device is composed of a semiconductor chip 1 and an electronic part 2, and the electronic part 2 is fixed to the side 1*b* of the semiconductor chip 1. The electronic part 2 is a part such as a chip resistor or a chip capacitor.

Figure 2:
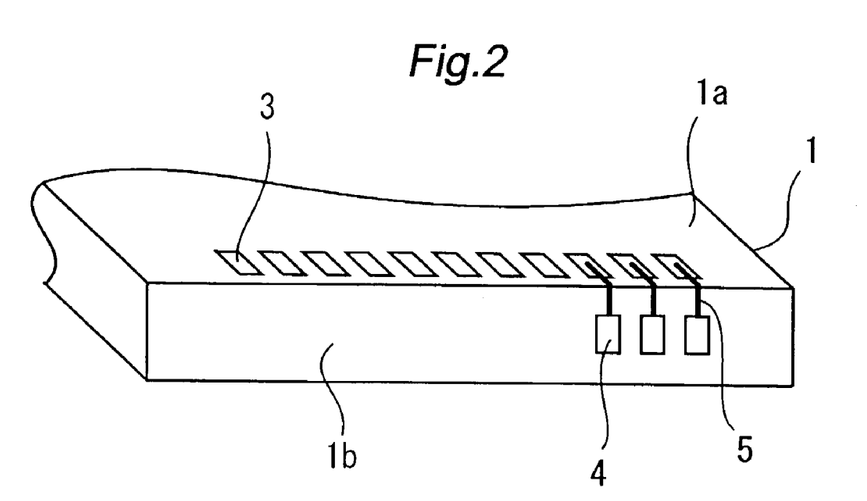
FIG. 2 is a perspective view showing a semiconductor chip before mounting the electronic part.

FIG. 2 is a perspective view showing a semiconductor chip 1 before mounting the electronic part 2. As FIG. 2 shows, a plurality of electrode pads 3 are formed on the upper surface 1*a* of the semiconductor chip 1, and a plurality of side terminals 4 are formed on the side 1*b*. The electrode pads 3 are electrically connected to side terminals 4 through wiring patterns 5. The wiring patterns 5 may be formed on the semiconductor chip 1 as integral patterns with the electrode pads 3 and side terminals 4, or may be constituted from separate members. A plurality of terminals (not shown) is provided on the locations corresponding to the side terminals 4 on the side of the electronic part 2. In the state shown in FIG. 1, the side terminals 4 contact and are connected to the terminals of the electronic part 2 respectively, and the semiconductor chip 1 is electrically connected to the electronic part 2. The connection between the semiconductor chip 1 and the electronic part 2 can be performed using a method such as reflow.

By thus disposing the electronic part 2 on the side 1*b* of the semiconductor chip 1, and directly connecting the side terminal 4 with the terminal of the electronic part 2, the total size including the semiconductor chip 1 and the electronic part 2 can be minimized, and the significant downsizing of semiconductor devices can be accomplished.

Since the electronic part 2 is directly connected to the semiconductor chip 1, the wiring path can be shortened significantly comparing to the case of connecting through a gold wire or the wiring pattern of the packaging substrate. Therefore, the electrical properties of semiconductor devices can be improved.

Second Embodiment

FIGS. 3 to 6 are schematic diagrams showing Second Embodiment of the present invention. In Second Embodiment, a tape (adhesive tape) 6 is bonded on a semiconductor chip 1' having no side terminals 4, and the conductive pattern formed on the tape 6 substitutes the side terminals of First Embodiment. The electronic part 2 of First Embodiment is connected to the side terminals provided by the conductive pattern.

Figure 3:
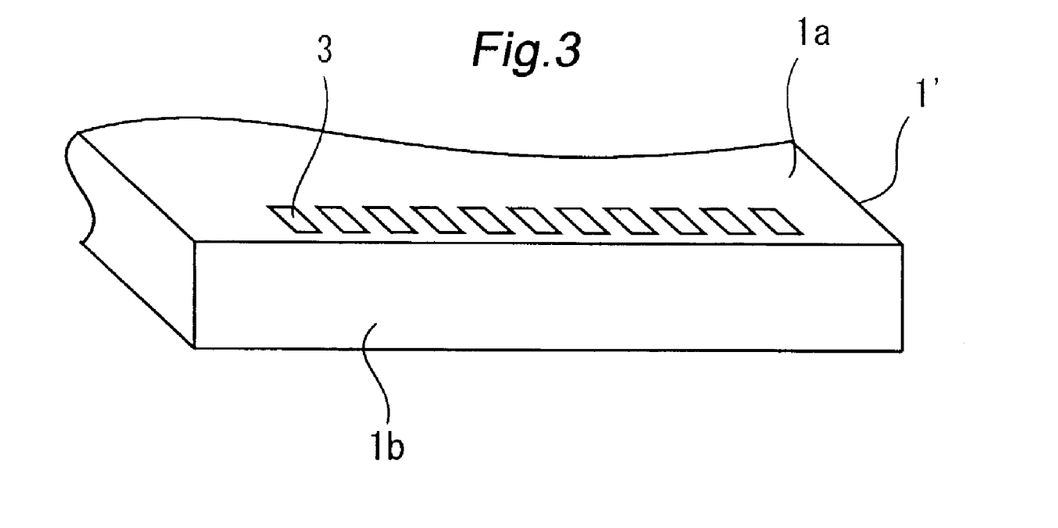
FIG. 3 is a schematic diagram showing a semiconductor chip whereon a tape is bonded according to second Embodiment of the present invention.

FIG. 3 is a schematic diagram showing a semiconductor chip 1' whereon an tape 6 is bonded. Similarly to the semiconductor chip 1 of First Embodiment, a plurality of electrode pads 3 are formed on the upper surface 1*a* of the semiconductor chip 1'. On the other hand, the semiconductor chip 1' differs from the semiconductor chip 1 of FIG. 1 in that the semiconductor chip 1' has no side terminals 4 and the wiring patterns 5.

Figure 4:
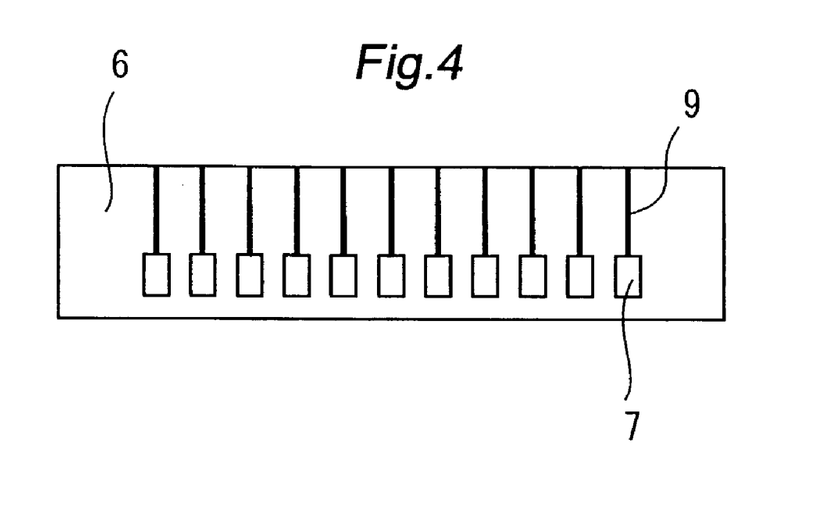
FIG. 4 is a plan showing the surface of the tape.
Figure 5:
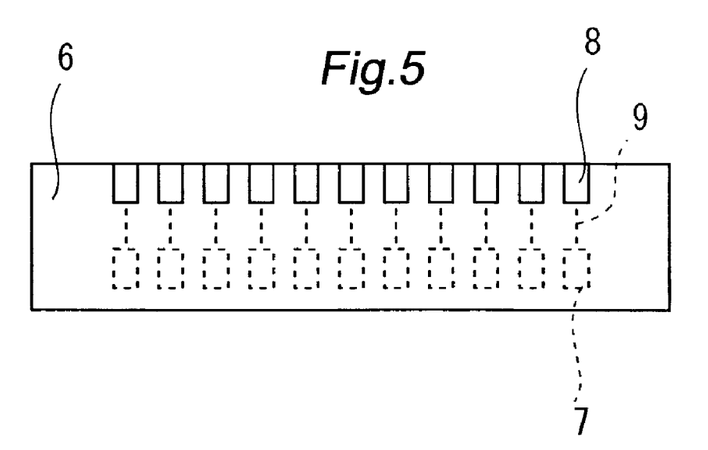
FIG. 5 is a plan showing the back of the tape.

FIG. 4 is a plan showing the surface of the tape 6; and FIG. 5 is a plan showing the back of the tape 6. As FIG. 4 shows, terminals 7 to be connected to the terminals provided on the side of the electronic part 2 are formed on the surface of the tape 6. On the back of the tape 6 are formed terminals 8 corresponding to the locations of electrode pads 3 of the semiconductor chip 1', and the terminals 7 are electrically connected to the terminals 8 through conductive patterns 9. An adhesive is applied to the bake of the tape 6.

Figure 6:
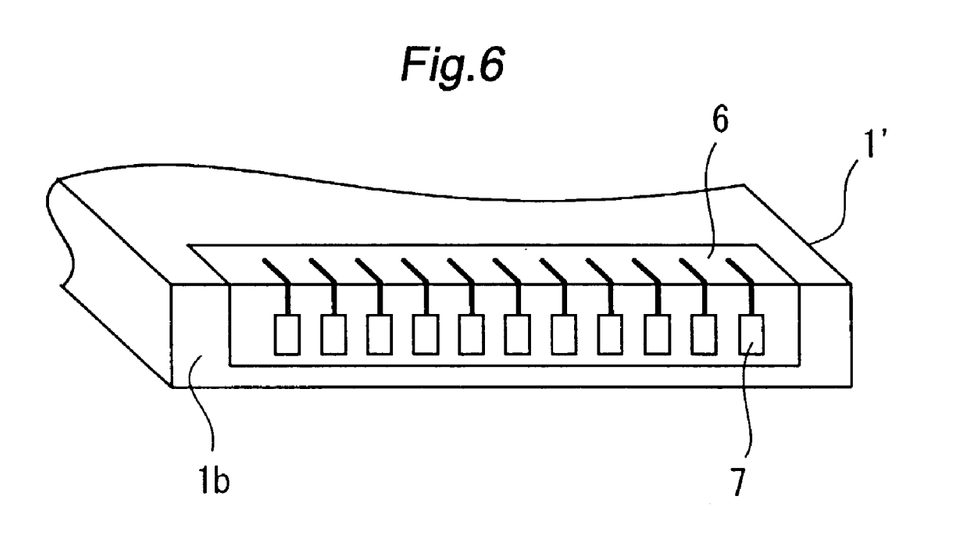
FIG. 6 is a schematic diagram showing the state where the tape has been bonded to the semiconductor chip.

FIG. 6 is a schematic diagram showing the state where the tape 6 has been bonded to the semiconductor chip 1'. The tape 6 is bonded on the upper surface 1*a* of the semiconductor chip 1' in the state where the locations of the terminals 8 are aligned to the locations of the electrode pads 3, and the electrode pads 3 contact and are electrically connected to the terminals 8 respectively. The terminal 7 side of the tape 6 is folded, and bonded to the side 1*b* of the semiconductor chip 1'.

By thus bonding the tape 6 on the semiconductor chip 1', the terminals 7 electrically connected to electrode pads 3 can be provided on the side 1*b* of the semiconductor chip 1', and the terminals 7 function similarly to the side terminals 4 in First Embodiment. Thereby, even if the semiconductor chip is not provided with side terminals 4, side terminals can be provided easily at low costs by bonding the tape 6. In addition, by fixing the electronic part 2 on the terminals 7, the electronic part 2 can be directly disposed on the side of the semiconductor chip in the same manner as First Embodiment.

Third Embodiment

Figure 7:
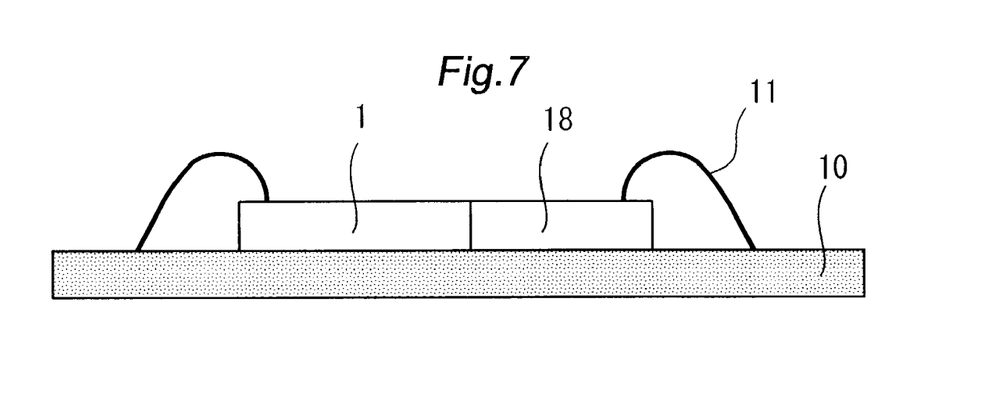
FIG. 7 is a schematic diagram showing Third Embodiment of the present invention.

FIG. 7 is a schematic diagram showing Third Embodiment of the present invention. In Third Embodiment, the semiconductor chip 1 of FIG. 1 is electrically connected to a semiconductor chip 18 similar to the semiconductor chip 1 in the state where the sides of the semiconductor chips 1 and 18 approach to each other.

As FIG. 7 shows, the semiconductor chip 1 and the semiconductor chip 18 are mounted on a packaging substrate 10, and are electrically connected in the state where the sides thereof approach to each other. The semiconductor chip 1 and the semiconductor chip 18 are electrically connected to the packaging substrate 10 through gold wires 11. By providing side terminals described in First and Second Embodiments on the side of both semiconductor chips 1 and 18, both chips can be electrically connected through the side terminals.

Thereby the connection between the semiconductor chip 1 and the semiconductor chip 18 with a gold wire becomes unnecessary, and the wiring length between the semiconductor chip 1 and the semiconductor chip 18 can be shortened significantly. Also in the connection to the packaging substrate 10, wire bonding can be minimized to a least required limit, and the semiconductor chips can be easily contacted to each other. Furthermore, by approaching the semiconductor chip 1 to the semiconductor chip 18, the path of the wiring patterns on the packaging substrate 10 formed around the semiconductor chip 1 and the semiconductor chip 18 can be shortened. Thereby, the significant downsizing of the semiconductor device can be accomplished, and electrical properties can be improved.

Fourth Embodiment

Figure 8:
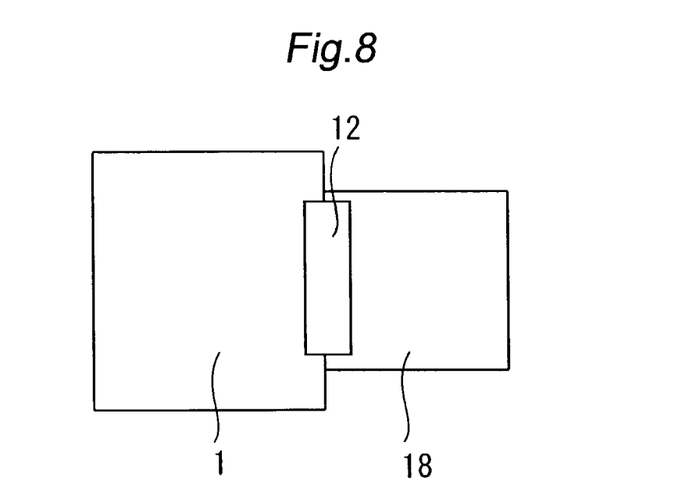
FIG. 8 is a plan showing the state where the semiconductor chip has been connected to the semiconductor chip using the tape according to fourth Embodiment of the present invention.
Figure 9:
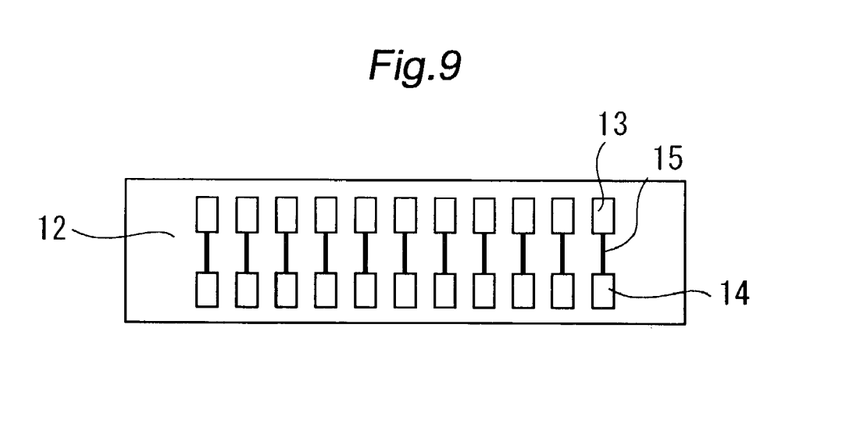
FIG. 9 is a plan showing the back of the tape.

FIGS. 8 and 9 are schematic diagrams showing Fourth Embodiment of the present invention. In Fourth Embodiment, the connection of the semiconductor chip 1 to the semiconductor chip 18 of Third Embodiment is performed using a tape (adhesive tape) 12.

FIG. 8 is a plan showing the state where the semiconductor chip 1 has been connected to the semiconductor chip 18 using the tape 12. Similarly to First Embodiment, electrode pads 3 are provided on the surface 1*a* of the semiconductor chip 1, and electrode pads are also provided on the surface of the semiconductor chip 18.

FIG. 9 is a plan showing the back of the tape 12. As FIG. 9 shows, two pairs of terminals 13 and 14 are formed on the back of the tape 12, and terminals 13 are electrically connected to terminals 14 with conductive patterns 15 formed therebetween. The terminals 13 and 14 are formed on the locations corresponding to the electrode pads 3 on the upper surface of the semiconductor chip 1, and the electrode pads on the upper surface of the semiconductor chip 18, respectively.

By aligning the locations of terminals 13 and 14 of the tape 12 to the locations of electrode pads on the upper surfaces of semiconductor chips 1 and 18, and as FIG. 8 shows, bonding the back side of the tape 12 to the upper surfaces of semiconductor chips 1 and 18, the electrode pads of the semiconductor chip 1 and the electrode pads of the semiconductor chip 18 can be connected to each other.

Thereby, the semiconductor chip 1 can be connected to the semiconductor chip 18 only by bonding the tape 12 to the upper surfaces of semiconductor chips 1 and 18, and the structure of Third Embodiment can be realized easily. Since chips can be connected to each other by using the tape 12, it is unnecessary to form side terminals on the chips, the constitution of each semiconductor chip can be simplified, and the costs can be reduced.

Fifth Embodiment

Figure 10:
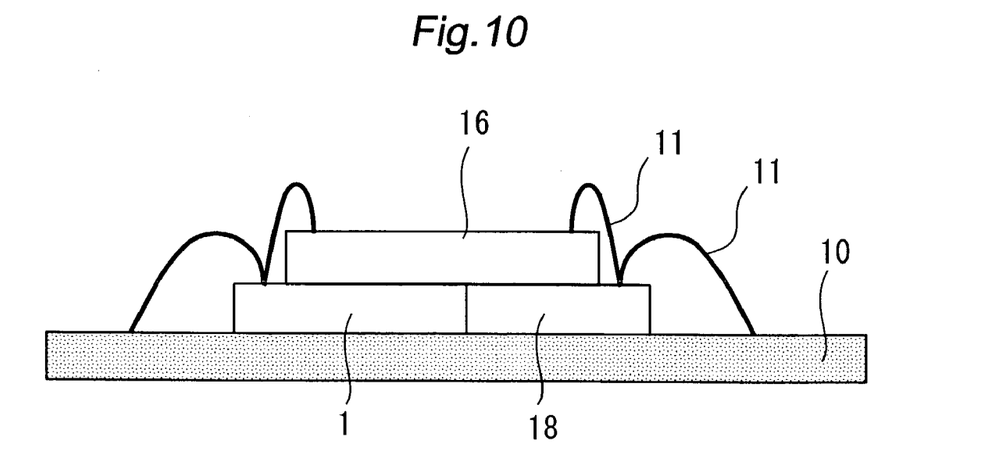
FIG. 10 is a schematic diagram showing Fifth Embodiment of the present invention.

FIG. 10 is a schematic diagram showing Fifth Embodiment of the present invention. In Fifth Embodiment, the semiconductor chip 1 is electrically connected to the semiconductor chip 18 in the state where the sides thereof approach to each other as in Third and Fourth Embodiments, and furthermore, a semiconductor chip 16 is mounted on the semiconductor chip 1 and the semiconductor chip 18. The electrical connection of the semiconductor chip 16 to the semiconductor chips 1 and 18 is performed using gold wires 11.

As described in Third and Fourth Embodiments, by electrically connecting the semiconductor chip 1 to the semiconductor chip 18 in the state where the sides thereof approach to each other, the semiconductor chip 16 can be further mounted on the semiconductor chips 1 and 18. Thereby, a large number of semiconductor chips can be mounted on a limited space, a significant downsizing of semiconductor devices can be accomplished, and the wiring paths can be shortened significantly.

The semiconductor chip 1, 1', 16, or 18 and the electronic part 2 (a chip resistor, a chip capacitor, etc.) described in above Embodiments correspond to the "chip part" in the claims of the present application.

Since the present invention is constituted as described above, the following effects can be obtained.

Since terminals on the sides of chip parts are electrically connected each other, the total size of a semiconductor device containing chip parts can be reduced. Since no wiring such as gold wires is required for the electrical connection of chip parts to each other, the wiring path can be shortened significantly, and the electrical properties of semiconductor devices can be improved.

Since wiring patterns are provided for connecting electrode pads on the upper surface of a chip part to the terminals of the side, the electrode pads can be drawn to the side surface through the wiring patterns.

By bonding a tape, whereon a predetermined conductive pattern is formed, on the electrode pads to the side of a chip part, terminals can be provided on the side of the chip part.

By bonding a tape, whereon a predetermined conductive pattern is formed, on the electrode pads of a chip part, the chip parts can be electrically connected to each other.

By disposing another chip part on at least two chip parts electrically connected to each other, a large number of parts can be packaged without enlarging the two-dimensional size of a semiconductor device.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2002-181809, filed on Jun. 21, 2002 including specification, claims, drawings and summary, on which the Convention priority of the present application is based, are incorporated herein by reference in its entirety.

What is claimed is:

1. A semiconductor device comprising:
   a packaging substrate;
   a first semiconductor chip having electrode pads formed on an upper surface thereof;
   a second semiconductor chip having electrode pads formed on an upper surface thereof; and
   a third semiconductor chip having electrode pads formed on an upper surface thereof, wherein
   the first semiconductor chip and the second semiconductor chip are mounted on the packaging substrate such that lower surfaces of the first and second semiconductor chips face the packaging substrate, and electrically connected to each other through conductive patterns on tape, and a side surface of the first and second semiconductor chips approach one another,
   the third semiconductor chip is mounted on the upper surface of the first semiconductor chip and the upper surface of the second semiconductor chip, and arranged over the approaching side surfaces of the first and second semiconductor chips,
   the electrode pads of the third semiconductor chip are electrically connected with the packaging substrate through bonding wires,
   one or more of the electrode pads of the first semiconductor chip and the second semiconductor chip are electrically connected with the packaging substrate through bonding wires,
   the tape and the conductive patterns on the tape are bridging over the approaching side surfaces of the first and second semiconductor chips, and
   the third semiconductor chip is arranged over the tape.

* * * * *

UNITED STATES PATENT AND TRADEMARK OFFICE
CERTIFICATE OF CORRECTION

PATENT NO. : 6,984,882 B2
DATED : January 10, 2006
INVENTOR(S) : Hironori Matsushima

It is certified that error appears in the above-identified patent and that said Letters Patent is hereby corrected as shown below:

<u>Title page,</u>
"1 Claim, 7 Drawing Sheets" should read -- 1 Claim, 6 Drawing Sheets --; and <u>Drawings,</u>
Delete Sheet 2 of 7.

Signed and Sealed this

Sixth Day of June, 2006

JON W. DUDAS
*Director of the United States Patent and Trademark Office*